(12) United States Patent
Lu et al.

(10) Patent No.: US 7,884,454 B2
(45) Date of Patent: Feb. 8, 2011

(54) USE OF DISCRETE CONDUCTIVE LAYER IN SEMICONDUCTOR DEVICE TO RE-ROUTE BONDING WIRES FOR SEMICONDUCTOR DEVICE PACKAGE

(75) Inventors: Jun Lu, San Jose, CA (US); Anup Bhalla, Santa Clara, CA (US); Xiaobin Wang, San Jose, CA (US); Allen Chang, Fremont, CA (US); Man Sheng Hu, San Francisco, CA (US); Xiaotian Zhang, San Jose, CA (US)

(73) Assignee: Alpha & Omega Semiconductor, Ltd, Hamilton (BM)

( * ) Notice: Subject to any disclaimer, the term of this patent is extended or adjusted under 35 U.S.C. 154(b) by 146 days.

(21) Appl. No.: 12/209,106

(22) Filed: Sep. 11, 2008

(65) Prior Publication Data
US 2009/0008758 A1    Jan. 8, 2009

Related U.S. Application Data

(63) Continuation-in-part of application No. 11/944,313, filed on Nov. 21, 2007, and a continuation-in-part of application No. 11/150,489, filed on Jun. 10, 2005, now Pat. No. 7,511,361, which is a continuation-in-part of application No. 11/029,653, filed on Jan. 5, 2005, now abandoned, application No. 12/209,106, which is a continuation-in-part of application No. 11/316,614, filed on Dec. 22, 2005, now Pat. No. 7,612,439.

(51) Int. Cl.
*H01L 23/495* (2006.01)

(52) U.S. Cl. .......... 257/676; 257/666; 257/686; 257/780; 257/781; 257/E23.031; 257/E23.039; 257/E23.059; 257/E23.079; 438/123

(58) Field of Classification Search .......... 257/666, 257/676, 691, 723, 724, 685, 341, 773, 780–782, 257/784, 670, 686, 777, E25.006, E25.013, 257/E25.018, E25.021, E25.027, E23.085, 257/E23.001–E23.194; 438/19, 25, 74, 210, 438/455, 111, 112, 123, FOR. 366, FOR. 367, 438/FOR. 380
See application file for complete search history.

(56) References Cited

U.S. PATENT DOCUMENTS 5,495,398 A    2/1996    Takiar et al.
(Continued)

FOREIGN PATENT DOCUMENTS

| KR | 10-0826989 | 11/2004 |
| KR | 10-2004-92304 | 5/2008 |
| TW | 375330 | 11/1999 |

OTHER PUBLICATIONS

International Search Report and Written Opinion of the International Searching Authority dated Apr. 6, 2009 for the International Patent Application No. PCT/US2008/074924, 11 pages.
(Continued)

*Primary Examiner*—Jasmine J Clark
(74) *Attorney, Agent, or Firm*—Joshua D. Isenberg; JDI Patent

(57) ABSTRACT

A semiconductor package assembly may include a lead frame having a die bonding pad and plurality of leads coupled to the first die bonding pad. A vertical semiconductor device may be bonded to the die bonding pad. The device may have a conductive pad electrically connected to one lead through a first bond wire. An electrically isolated conductive trace may be formed from a layer of conductive material of the first semiconductor device. The conductive trace provides an electrically conductive path between the first bond wire and a second bond wire. The conductive path may either pass underneath a third bond wire thereby avoiding the third bond wire crossing another bond wire, or the conductive path may result in a reduced length for the first and second bond wires that is less than a predetermined maximum length.

20 Claims, 5 Drawing Sheets

U.S. PATENT DOCUMENTS

| | | | |
|---|---|---|---|
| 5,557,842 | A | 9/1996 | Bailey |
| 5,814,884 | A | 9/1998 | Davis et al. |
| 5,917,241 | A | 6/1999 | Nakayama et al. |
| 6,031,279 | A | 2/2000 | Lenz |
| 6,055,148 | A | 4/2000 | Grover |
| 6,184,585 | B1 | 2/2001 | Martinez et al. |
| 6,249,041 | B1 | 6/2001 | Kasem et al. |
| 6,265,763 | B1 | 7/2001 | Jao et al. |
| 6,414,387 | B1 | 7/2002 | Hara et al. |
| 6,424,035 | B1 | 7/2002 | Sapp et al. |
| 6,593,622 | B2 | 7/2003 | Kinzer et al. |
| 6,677,669 | B2 | 1/2004 | Standing |
| 6,777,800 | B2 | 8/2004 | Madrid et al. |
| 6,841,852 | B2 | 1/2005 | Luo et al. |
| 6,858,922 | B2 | 2/2005 | Pavier |
| 6,864,588 | B2 * | 3/2005 | Hung .................. 257/787 |
| 6,933,593 | B2 | 8/2005 | Fissore et al. |
| 7,030,501 | B2 | 4/2006 | Yoshiba et al. |
| 7,057,273 | B2 | 6/2006 | Harnden et al. |
| 7,088,074 | B2 | 8/2006 | Clevenger et al. |
| 7,115,985 | B2 * | 10/2006 | Antol et al. .................. 257/700 |
| 7,166,496 | B1 | 1/2007 | Lopez et al. |
| 7,166,919 | B2 | 1/2007 | Tabira |
| 7,183,616 | B2 | 2/2007 | Bhalla et al. |
| 7,215,012 | B2 | 5/2007 | Harnden et al. |
| 7,301,235 | B2 | 11/2007 | Schaffer et al. |
| 7,508,012 | B2 | 3/2009 | Otremba |
| 7,511,361 | B2 | 3/2009 | Zhang et al. |
| 7,514,778 | B2 | 4/2009 | Otremba et al. |
| 7,612,439 | B2 | 11/2009 | Zhang et al. |
| 2001/0019490 | A1 | 9/2001 | Igarashi et al. |
| 2002/0093094 | A1 | 7/2002 | Takagawa et al. |
| 2002/0163040 | A1 | 11/2002 | Kinzer et al. |
| 2004/0004272 | A1 | 1/2004 | Luo et al. |
| 2004/0227547 | A1 | 11/2004 | Shiraishi et al. |
| 2004/0251529 | A1 | 12/2004 | Lee et al. |
| 2005/0017339 | A1 | 1/2005 | Yoshiba et al. |
| 2005/0082679 | A1 | 4/2005 | Otremba |
| 2005/0133902 | A1 | 6/2005 | Pavier et al. |
| 2005/0145996 | A1 | 7/2005 | Luo et al. |
| 2005/0145998 | A1 | 7/2005 | Harnden et al. |
| 2006/0118815 | A1 | 6/2006 | Otremba et al. |
| 2006/0145312 | A1 | 7/2006 | Liu |
| 2006/0145318 | A1 | 7/2006 | Zhang et al. |
| 2007/0007640 | A1 | 1/2007 | Harnden et al. |
| 2007/0080443 | A1 | 4/2007 | Sun et al. |
| 2007/0085187 | A1 | 4/2007 | Sun et al. |
| 2007/0145609 | A1 | 6/2007 | Zhang et al. |
| 2007/0215996 | A1 | 9/2007 | Otremba |
| 2008/0111219 | A1 | 5/2008 | Harnden et al. |
| 2008/0207094 | A1 | 8/2008 | Feng et al. |
| 2008/0224323 | A1 | 9/2008 | Otremba |
| 2008/0242052 | A1 | 10/2008 | Feng et al. |
| 2008/0296782 | A1 | 12/2008 | Otremba et al. |
| 2009/0008758 | A1 | 1/2009 | Lu et al. |
| 2009/0020854 | A1 | 1/2009 | Feng et al. |
| 2009/0128968 | A1 | 5/2009 | Lu et al. |
| 2009/0179265 | A1 | 7/2009 | Harnden et al. |
| 2009/0189281 | A1 | 7/2009 | Han |
| 2009/0258458 | A1 | 10/2009 | Zhang et al. |

OTHER PUBLICATIONS

Office Action dated Nov. 24, 2009 for U.S. Appl. No. 11/944,313.
Ex Parter Quayle Action dated Nov. 25, 2008 for U.S. Appl. No. 11/316,614.
Notice of Allowance and Fee(s) Due dated Jun. 25, 2009 for U.S. Appl. No. 11/316,614.
Office Action dated May 16, 2007 for U.S. Appl. No. 11/150,489.
Notice of Allowance and Fee(s) Due dated Nov. 17, 2008 for U.S. Appl. No. 11/150,489.
Final Office Action dated Feb. 25, 2008 for U.S. Appl. No. 11/150,489.
Final Office Action dated February 23, 2010 for U.S. Appl. No. 11/029,653.
International Search Report and Written Opinion of International Application No. PCT/US06/00356, mailing date Jul. 19, 2006.
Notification concerning availability of the publication of the International Application of PCT/US06/00356, mailing date Nov. 9, 2006.
Notification concerning transmittal of international preliminary report for PCT/US06/00356, mailing date Jul. 19, 2007.
International Search Report and Written Opinion of International Application No. PCT/US2006/022909 mailing date Feb. 28, 2008.
Notification Concerning Transmittal of international Preliminary Report on Patentability for PCT/US2006/022909, Mailing date Mar. 19, 2009.
Office Action dated Aug. 18, 2009 for U.S. Appl. No. 11/029,653.
U.S. Appl. No. 12/384,100, filed Mar. 30, 2009, entitled DFN Semiconductor Package Having Reduced Electrical Resistance and identifying Xiaotian Zhang et al. as inventors.
English translation of Taiwanese model No. 375330 published Nov. 21, 1999.
Notice of Allowance and Fee(s) Due dated Sep. 17, 2008 for U.S. Appl. No. 11/029,653.
Office Action dated Mar. 20, 2008 for U.S. Appl. No. 11/029,653.
General definition of Dual Flat No lead by www.answers.com search word: Dual flat no lead.
Advisory Action dated Nov. 27, 2007 for U.S. Appl. No. 11/029,653.
Final Office Action dated Aug. 6, 2007 for U.S. Appl. No. 11/029,653.
Office Action dated Nov. 28, 2006 for U.S. Appl. No. 11/029,653.
Office Action dated Feb. 22, 2006 issued for U.S. Appl. No. 11/029,653.
Office Action dated Apr. 14, 2010 issued for U.S. Appl. No. 11/944,313.
Advisory Action dated Jul. 28, 2008 issued for U.S. Appl. No. 11/150,489.
Notice of Allowance and Fees Due dated Jun. 23, 2008 issued for U.S. Appl. No. 11/316,614.
Office Action dated Feb. 6, 2008 issued for U.S. Appl. No. 11/316,614.
Bonnie C. Baker, "Smaller Packages=Bigger Thermal Challenges", 2003 Microchip Technology, Inc.
Notice of Allowance and Fees Due dated Oct. 1, 2010 issued for U.S. Appl. No. 11/944,313.
Notice of Rejection dated Nov. 16, 2010 issued for Korean patent application No. 10-2009-0019811.

* cited by examiner

USE OF DISCRETE CONDUCTIVE LAYER IN SEMICONDUCTOR DEVICE TO RE-ROUTE BONDING WIRES FOR SEMICONDUCTOR DEVICE PACKAGE

CROSS REFERENCE TO RELATED APPLICATION

This application is a continuation in part (CIP) application of U.S. application Ser. No. 11/944,313 filed Nov. 21, 2007, the entire disclosures of which are incorporated herein by reference.

This application is a continuation in part (CIP) application of U.S. application Ser. No. 11/150,489 filed Jun. 10, 2005 now U.S. Pat. No. 7,511,361 and published as US Patent Application Publication number 20060145318, which is a CIP of U.S. application Ser. No. 11/029,653 filed Jan. 5, 2005 now abandoned and published as US Patent Application Publication number 20060145312 the entire disclosures of all of which are incorporated herein by reference.

This application is a continuation in part (CIP) application of U.S. application Ser. No. 11/316,614 filed Dec. 22, 2005 now U.S. Pat. No. 7,612,439 and published as US Patent Application Publication 20070145609, the entire disclosures of which are incorporated herein by reference.

FIELD OF THE INVENTION

This invention generally relates to semiconductor device packages and more particularly to avoiding problems with wire bonding in semiconductor device packages.

BACKGROUND OF THE INVENTION

Semiconductor devices are often packaged on die pads with lead frames. The lead frames provide leads that allow for electrical connection from the device package to other components of a device or system. Electrical connections are made from leads on the lead frame to conductive pads on the semiconductor device through bond wires. There are a number of rules that affect the routing of the bond wires. One rule is that two bond wires cannot cross. Another rule is that bond wires must be less than a predetermined maximum length. Typically, the maximum length for a bond wire is about 200-300 mils. These rules may present problems when a semiconductor device package is designed by one manufacturer and uses semiconductor device components from two or more different manufacturers. An example of such a situation may arise, e.g., in the context of a battery controller circuit.

A typical battery pack used in portable electronic apparatuses includes a plurality of bare cells, a protective circuit module (PCM) in which a protective circuit for controlling the charge and discharge of the bare cells is formed, and a terminal line for electrically connecting the bare cells and the protective circuit to each other. The bare cells, the PCM, and the terminal line can be accommodated in a predetermined case.

The charge management system and battery protection IC offer extensive battery over-voltage and over-current protection, battery pre-conditioning and one percent charger voltage accuracy. They are placed in a small thermally enhanced lead frame package which may be a small surface mount device (SMD).

Conventional technologies to further reduce the size of battery protection integrated circuit (IC) are challenged by several technical difficulties and limitations. Conventional battery protection IC typically includes a power control IC and integrated dual common-drain metal oxide semiconductor field effect transistors (MOSFETs), which are packed in a lead frame package with a small foot print of a size as small as 2×5 mm. A composite or co-packaged device includes a power control IC stacked on top of integrated dual common-drain MOSFETs or overlapping two discrete MOSFETs with a single die pad may be utilized for attaching the MOSFETs of all configurations. FIG. 1A is a top view of a co-packaged device assembly 100 of the Prior Art.

As shown in FIG. 1A, dual common-drain MOSFETs 106 and 108, fabricated as a single piece of semiconductor chip, may be of the same source and gate size and attached onto a die pad 101 positioned on a lead frame 104. The die pad 101 may be separate from the lead frame 104 or may be an integral flat portion of the lead frame. The dual common drain MOSFETs 106, 108 may be fabricated as a single semiconductor chip that comprises a single dual common drain MOSFET die. The source and gate layout of the dual MOSFETs may be symmetric along the centerline of the MOSFETs. A power control IC 102 is stacked on top of the dual MOSFETs 106 and 108. In a preferred embodiment, the power control IC 102 may be non-conductively stacked on top of the dual MOSFETs 106 and 108. The substrate for the power control IC 102 is electrically isolated from the top of the dual MOSFETs 106 and 108. Input pads for the voltage monitor VM and supply voltage VDD of the power control IC 102 may be electrically connected to the VM and VCC leads of the lead frame 104 through bond wires 112 and 113 respectively. In the example illustrated in FIG. 1, input pad DP (a test pin for delay time shortening) may be electrically connected to a corresponding DP lead on the lead frame 104 through a bond wire 109. Output CO and DO pads of the power control IC 102 are electrically connected to gate pads G1 and G2 of MOSFETs 106 and 108 through bond wires 114 and 115 respectively. The VSS pad of power control IC 102 is electrically connected to VSS lead through a bond wire 116. Source pads S1 of the MOSFET 106 and source pads S2 of the MOSFET 108 may be electrically connected to OUTM lead and VSS and VSS1 leads through multiple bond wires 110 and 122 respectively.

However, as part of the application requirement for a battery PCM, the manufacturer of the PCM often utilizes a particular layout control IC 102 and MOSFETS 106, 108 that is incompatible with the pinout for a standard control IC 102 provided by the IC manufacturer. For example in the situation illustrated in FIG. 1A, in the pinout for the control IC 102 the DP pad is located between the VM and OUTM pads. As a result of this pinout and the layout of the IC 102 and MOSFETs 106, 108 on the die pad 101 and lead frame 104, the bond wires 109 and 112 would cross each other as shown in FIG. 1A. Such a crossing of bond wires is prohibited by standard wire bonding rules since it presents the risk of a short circuit. This rule applies even if the one wire is routed underneath the other so that the two wires avoid touching each other.

A straightforward solution for the bonding wire crossing problem as described above in FIG. 1A is shown in FIG. 1B. Pads on IC 102 are re-layout such that DP and VM pad positions are swapped. As shown in FIG. 1B, bond wires 109 and 112 do not cross each other. However, this solution requires a redesign of the control IC 102. Although seemingly straightforward, such a solution typically involves tremendous amount of effort, e.g., feasibility, cost, development time, may be needed to re-layout the pinout for the pads on the IC 102. This adds to the cost of the assembly 100. Also, the IC manufacturer may not be willing to re-design their IC.

Another solution for the bonding wire crossing problem is described in U.S. application Ser. No. 11/944,313, in which a different control IC 202 is used as shown in FIGS. 2A and 2B. FIG. 2A is a top view, and FIG. 2B is a cross-sectional view taken along a section B-B of the semiconductor package of FIG. 2A. In this example, the control IC 202 may be a standard IC that does not include DP pads. As shown in FIG. 2A, dual common-drain MOSFETs 206 and 208 may be of the same source and gate size and attached onto a die pad 200. The source and gate layout of the dual MOSFETs may be symmetric along the centerline of the MOSFETs. The power control IC 202 is stacked on top of the dual MOSFETs 206 and 208 and overlaps both portions of the source areas of MOSFETs 206 and 208 but not the gate areas. An insulating adhesive layer 203, such as an electrically non-conductive epoxy layer is used to attach the power control IC 202 to MOSFETs 206 and 208. The common drain pad of the MOSFETs 206 and 208 may be attached to the die pad 200 through an electrically conductive bonding agent 201. Input pads for the voltage monitor VM and supply voltage VCC of the power control IC 202 may be electrically connected to the VM and VCC leads of the package through bond wires 212 and 213 respectively. Output CO and DO pads of the power control IC 202 are electrically connected to gate pads G1 and G2 of MOSFETs 206 and 208 through bond wires 214 and 215 respectively. The VSS pad of power control IC 202 is electrically connected to the top source pad S2 of the MOSFET 208 through a bond wire 216. Source pads S1 of the MOSFET 206 and top source pads S2 of the MOSFET 208 may be electrically connected to fused OUTM leads 218 and fused VSS and VSS1 lead 220 through multiple bond wires 210 and 222 respectively.

Although this solution avoids the wire crossing problem, the die pad 200 has a different pinout than the die pad 104 of FIGS. 1A-1B. Often the manufacturer of the package assembly 100 has a specific pinout requirement for the die pad which cannot be changed without substantial re-engineering of the entire package assembly. Also a customer may not be willing to buy a part with a non-standard pinout. Furthermore, the manufacturer of the package assembly 100 may require the use specific control IC 102 and the DP output. In such a case, a substitution of the type shown in FIGS. 2A-2B may not be possible.

It would be desirable to develop a package which would use the same or smaller package for integrated dual common-drain MOSFETs while avoiding problems with bond wire crossing. It would be further desirable to produce such a package with a thinner package thickness. It would also be desirable to implement a solution that does not require changing the control IC pinout or the die pad layout. It would be further desirable if the solution could be implemented by the manufacturer of the MOSFETs.

BRIEF DESCRIPTION OF THE DRAWINGS

Objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Embodiments of the present invention overcome the above-described problems through the use of a semiconductor device that includes an electrically isolated conductive trace formed from a layer of conductive material in the top portion of the device. The conductive trace may be configured to provide an electrically conductive path between a first bond wire and a second bond wire. The conductive path may pass underneath a third bond wire thereby avoiding a situation where the third bond wire crosses with another bond wire. A bond wire which would otherwise cross with the third bond wire has been replaced with the first and second bond wires and the conductive trace. Alternatively, or additionally, the conductive path may result in a reduced length for the first or second bond wire that is less than a predetermined maximum length.

Figure 1A:
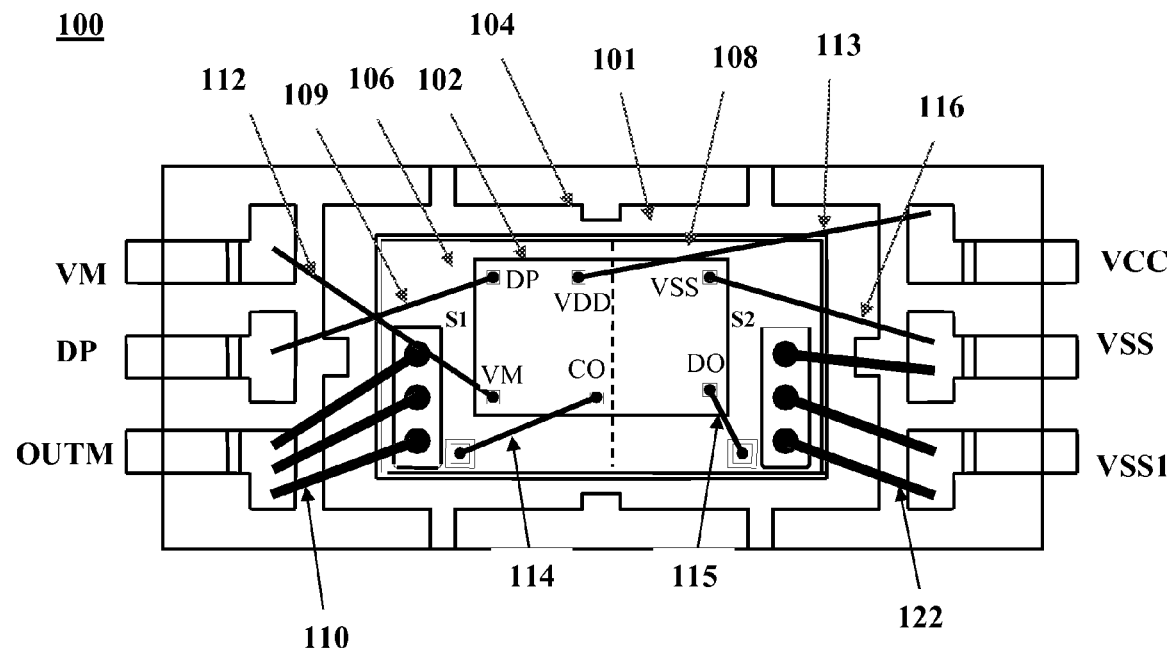
FIGS. 1A-1B are top views of a semiconductor package assemblies of the prior art.
Figure 1B:
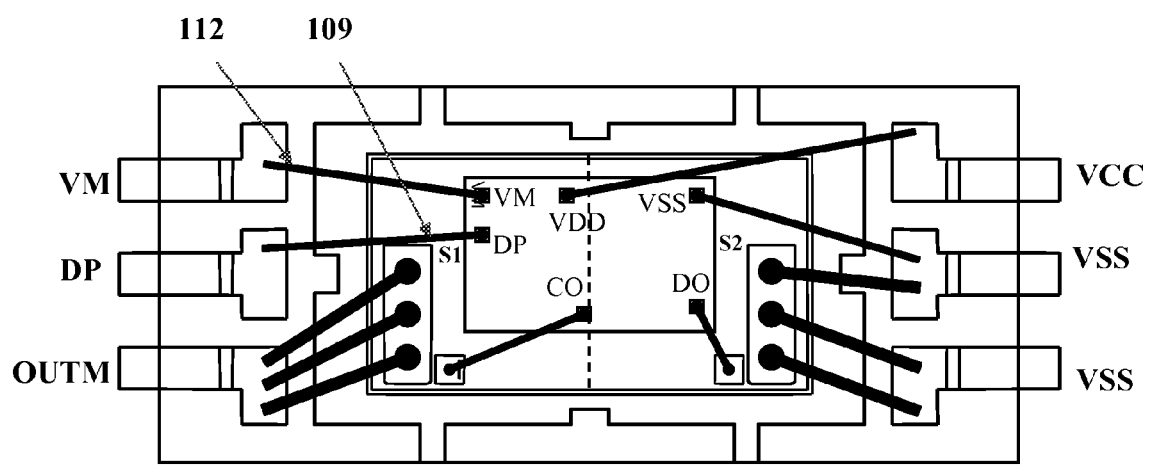
Figure 2A:
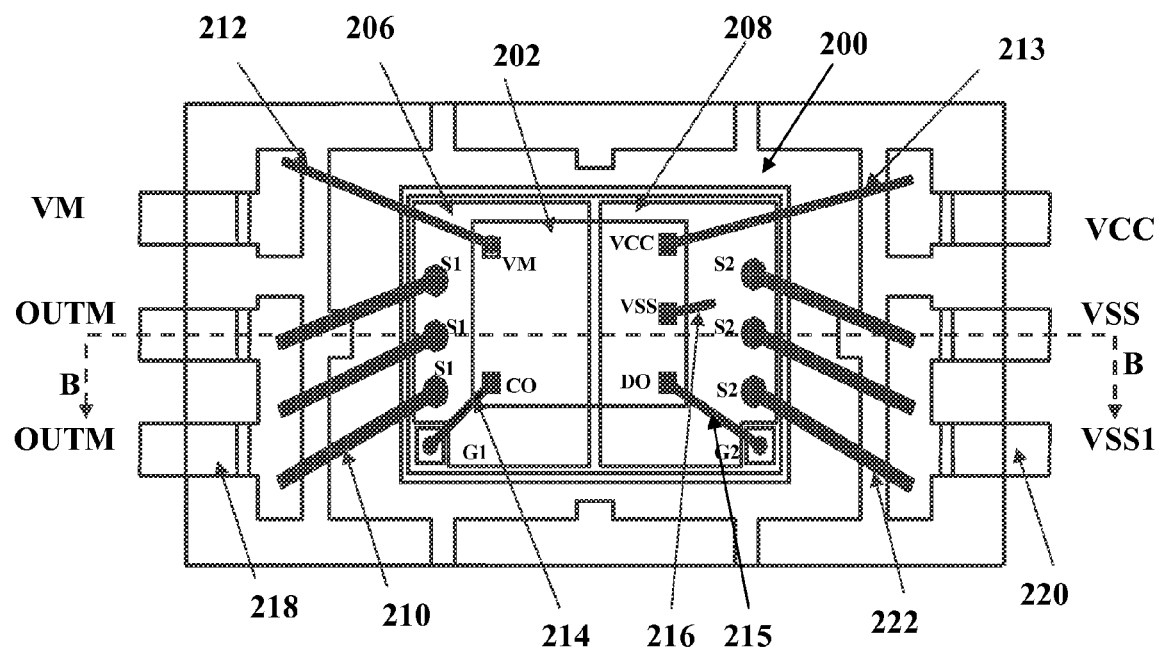
FIG. 2A is a top view of an alternative semiconductor package assembly of the prior art.
Figure 2B:
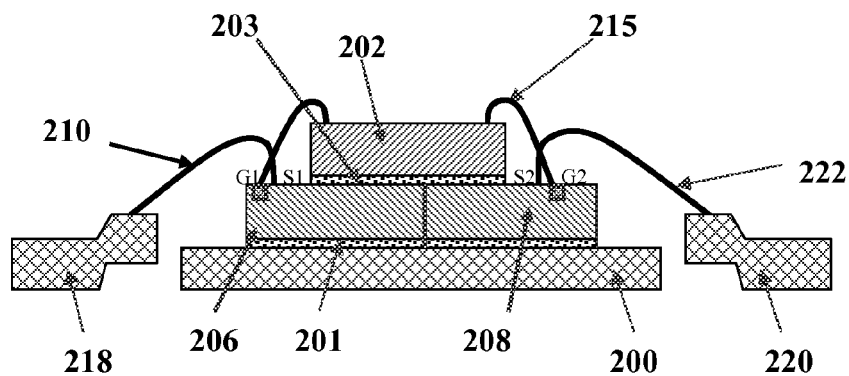
FIG. 2B is a cross-sectional view along a section B-B of the semiconductor package of FIG. 2A.
Figure 3A:
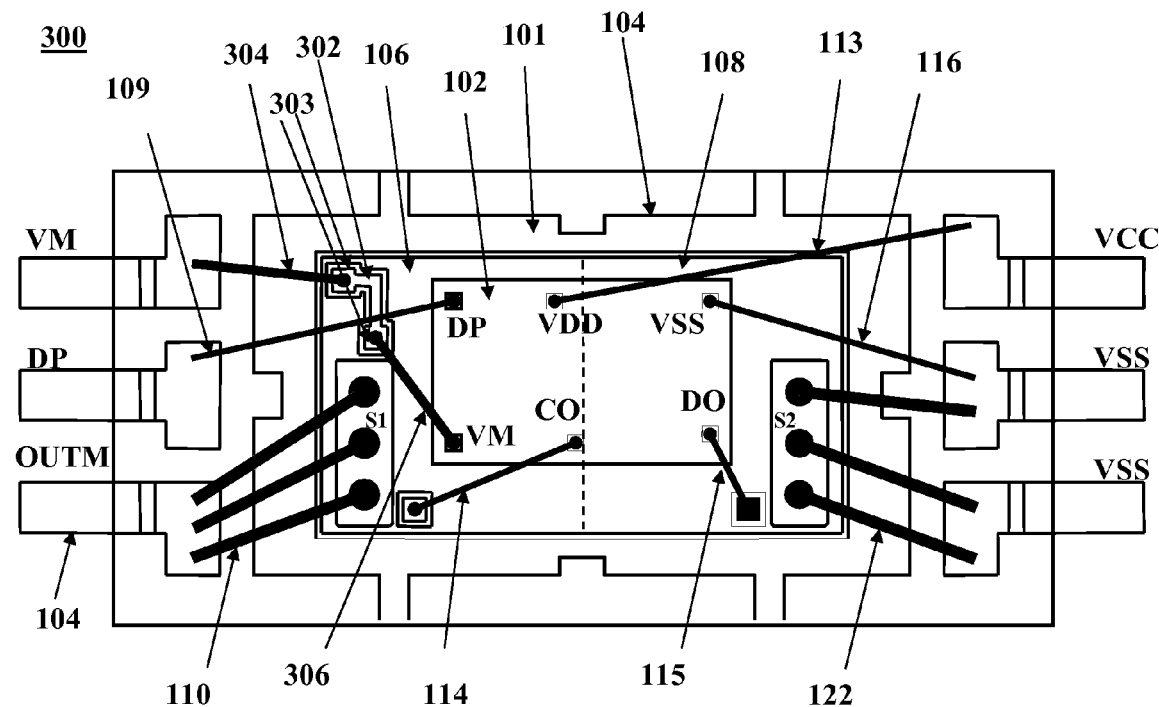
FIG. 3A is a top view of a semiconductor package assembly having a routing of bonding wires according to an embodiment of the present invention.

FIG. 3A is a top view of a semiconductor package assembly 300 having a routing of bonding wires according to an embodiment of the present invention. The semiconductor package assembly 300 has a structure similar to the semiconductor package assembly 100 as described above. As show in FIG. 3A, the semiconductor package assembly 300 includes dual common-drain MOSFETs 106 and 108 attached onto a die pad 101 positioned on a lead frame 104. The MOSFETS 106, 108 may be fabricated from a single piece of semiconductor and may have the same source and gate size. The source and gate layout of the dual MOSFETs 106, 108 may be symmetric along the centerline of the MOSFETs. A power control IC 102 is stacked on top of the dual MOSFETs 106 and 108. In a preferred embodiment the power control IC 102 may be non-conductively stacked on top of the dual MOSFETs 106 and 108.

Input pad for supply voltage VDD of the power control IC 102 may be electrically connected to the VCC leads of the lead frame 104 through bond wire 113. Input pad DP may be electrically connected to the DP lead through bond wire 109. Output CO and DO pads of the power control IC 102 are electrically connected to gate pads G1 and G2 of MOSFETs 106 and 108 through bond wires 114 and 115 respectively. The VSS pad of power control IC 102 is electrically connected to the VSS lead through a bond wire 116. Source pads S1 of the MOSFET 106 and source pads S2 of the MOSFET 108 may be electrically connected to OUTM leads and VSS and VSS1 leads through multiple bond wires 110 and 122 respectively.

In this embodiment, an electrically isolated conductive trace 302, such as a metal trace or a conductive poly trace, is formed in a conductive layer of one or both of the common-drain MOSFETs 106, 108. By way of example, the conductive trace 302 may be formed from the top metal layer of the device, e.g., the source metal layer. In the example shown in FIGS. 3A-3B, the trace 302 includes end pads 303 (sometimes referred to as wire bonding pads) that are sized and shaped to allow bond wires to be attached by conventional wire bonding techniques. The conductive trace 302 is electrically isolated from the conductive layers and active device regions within the MOSFET on which it is formed.

In particular, the conductive trace is electrically isolated from remaining portions of the conductive layer from which it is formed. For example, if formed from the top metal layer, the conductive trace 302 is electrically isolated from the rest of the top metal layer. The conductive trace 302 may be covered with passivation with only the end pads 303 exposed to allow for wire bonding. The input pad VM of the power control IC 102 may be electrically connected to the VM lead of the lead frame 104 through a bond wire 306, conductive trace 302 and bond wire 304. With this configuration, the bond wire between DP pad on the IC 102 and DP lead of the lead frame 104, i.e., bond wire 109, does not cross bond wire 306 or bond wire 304. Instead, the trace 302 provides a conductive path that passes under bond wire 109. In the example depicted in FIGS. 3A-3B, the conductive trace 302 provides a conductive path between the bond wires 304, 306 that allows electrical connection to be made between the VM pin on the lead frame 104 and the VM input pad on the control IC 102 without violating wire bonding rules that prohibit bond wires from crossing and without having to change the pin layout of either the control IC 102 or the lead frame 104.

Figure 3B:
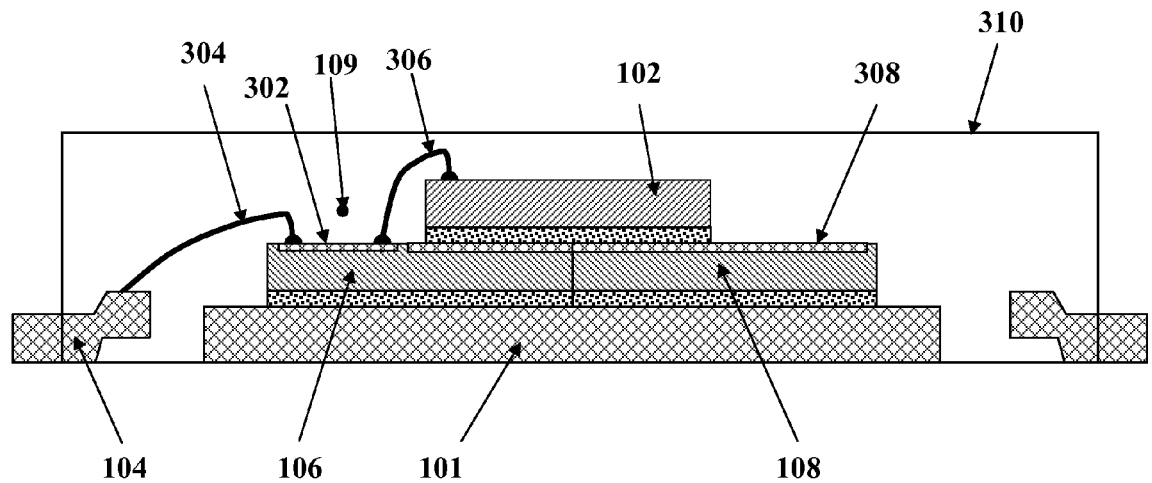
FIG. 3B is a cross-sectional view of the semiconductor package of FIG. 3A.
Figure 5:
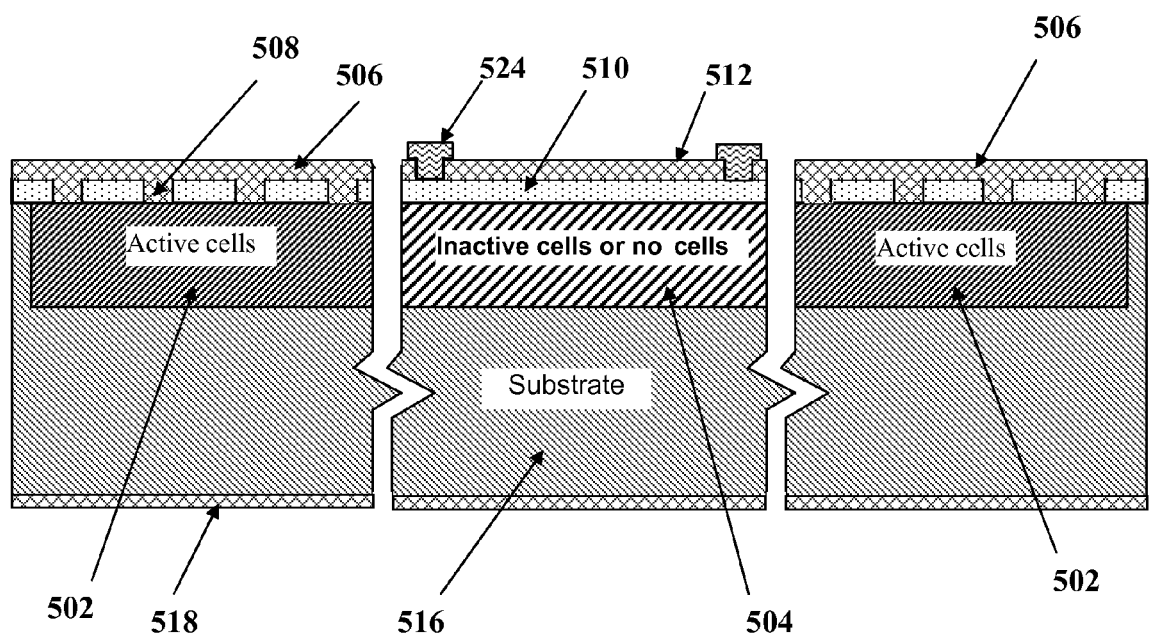
FIG. 5 is a cross-sectional view of a structure of MOSFET top layer having a routing of bonding wires according to another embodiment of the present invention.

FIG. 3B is a cross-sectional view of the semiconductor package of FIG. 3A. As shown in FIG. 3B, the conductive trace 302 is positioned at the top surface of the dual common drain MOSFET 106, 108 such that the conductive trace 302 is co-planar with the source metal layer 308 and is isolated from the source metal layer 308. By way of example, and not by way of limitation, the conductive trace 302 may be formed from the same layer of metal as the source metal layer 308 when this layer is patterned during manufacture of the MOSFET 106. In the example illustrated in FIG. 3B, the conductive trace 302 may be electrically isolated from underlying layers by a layer of electrically insulating material (not shown), such as an oxide (e.g., silicon dioxide) or nitride (e.g., silicon nitride). The same insulating layer may also isolate the source metal 308 from portions of the MOSFET 106, 108, while having openings to allow contact to other portions of the MOSFET 106, 108, as is found in standard MOSFETs. An example of the insulating layer is illustrated in FIG. 5. The conductive trace 302 may be isolated from the source metal layer 308 by forming a pattern of trenches through the metal layer down to the insulating material that surround the conductive trace 302 and physically separate it from contact with the rest of the source metal layer 308. These trenches may be filled with additional electrically insulating material.

The manufacturer of the MOSFET 106 may manufacture the MOSFET 106 using the same sequence of manufacturing steps normally used in the manufacture of a standard MOSFET, such as MOSFET 108. The main difference is that a different mask is used for patterning the source metal layer 308 than the standard mask used for patterning the source metal layer in a standard MOSFET, such as MOSFET 108. No additional masking step is required compared to a manufacturing process for a standard MOSFET that does not employ the conductive trace 302. This is very beneficial in terms of cost and effort. In some cases it may be necessary to isolate or inactivate MOSFET cells that lie underneath the trace 302. This may require changing one or more additional mask layers (e.g., the insulating layer mask). However, the basic process flow in manufacturing the MOSFET device would be little changed. Such a solution for bond wire routing issues may be implemented much more easily and much less expensively by the MOSFET manufacturer than a redesign of the control IC 102. The conductive trace 302 does not significantly degrade MOSFET device performance as the percentage of cells affected is a very small portion of the total number of cells in the MOSFET. The exact percentage depends on total actual routing area, but may be less than 5% of the total active cell area; in alternative cases employing multiple conductive traces, more than 5% of the total active cell area may be used.

There are a number of variations on the embodiment described above. For example, as shown in FIG. 3B is an optional encapsulant 310, which may cover the MOSFETS 106, 108, the control IC 102, connecting wires and die pad 101 to provide a package body. In addition, although the example depicted in FIGS. 3A-3B and elsewhere herein are described in terms of MOSFETs as the semiconductor devices in which a conductive trace is formed, those of skill in the art will recognize that embodiments of the invention may encompass the use of a conductive trace in any type of vertical discrete semiconductor device to resolve bond wire routing issues. Examples of suitable semiconductor devices include, but are not limited to field effect transistors, diodes, and insulated gate bipolar transistors (IGBT). Also, the invention may be applied to bottom-source MOSFETs in which the drain and gate are on the top surface, and the source is on the bottom. Some of these semiconductor devices may have an available conductive layer, with an insulator layer between the conductive layer and active semiconductor regions of the device. For example, a MOSFET device often has a source metal layer that may be used to form the trace. The source metal layer is typically isolated from portions of the active semiconductor layers (e.g., the gate) by an insulating layer such as an oxide. The insulating layer has openings in it to allow contact to the source and body regions. Other devices, such as diodes may require an additional layer of insulating material on top of active semiconductor material and a metal layer on top of the insulating material from which a conductive trace may be formed. The control IC may also be replaced by another device which together with the first semiconductor device (MOSFET or otherwise) requires the re-routing of bond wires.

Figure 4:
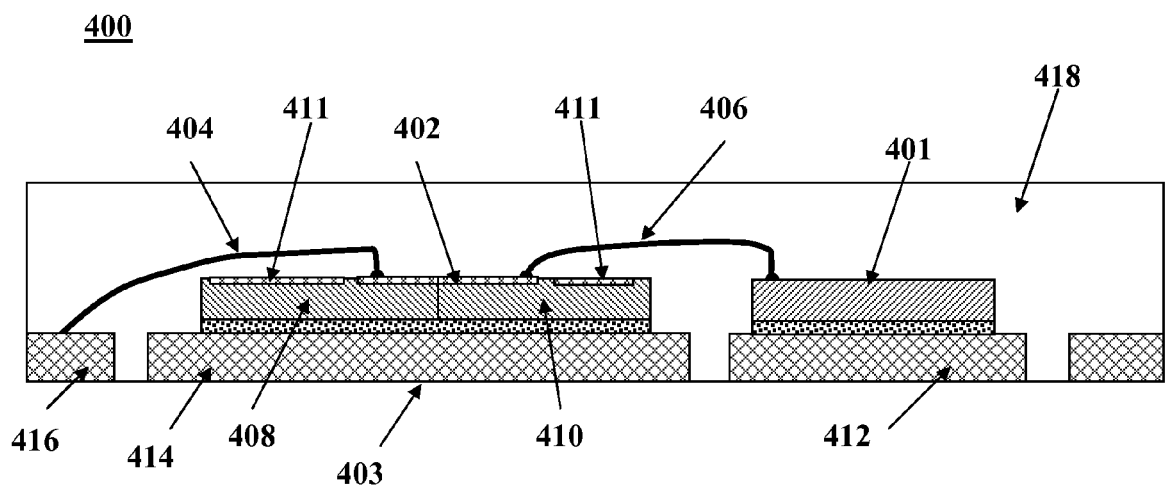
FIG. 4 is a cross-sectional view of another semiconductor package having a routing of bonding wires according to another embodiment of the present invention.

FIG. 4 is a cross-sectional view of another semiconductor package 400 having a routing of bonding wires according to another embodiment of the present invention. The semiconductor package 400 may be similar to the ones described in the US Patent Application publication 2007/0145609.

As shown in FIG. 4, the semiconductor package 400 may include a one or more semiconductor devices which are attached and electrically connected to a first die pad 414 of a lead frame 403. By way of example, a pair of common-drain MOSFETs 408, 410 may be bonded to the first die pad. A second semiconductor device, e.g., a power IC 401, may be bonded to a second die pad 412 of the lead frame. The first and second die pads 414 and 412 may have a lateral separation therebetween. An isolated conductive trace 402 is formed co-planar and electrically isolated from the source metal layers 411 of the MOSFETS 408 and 410. A conductive pad on the power control IC 401 is electrically connected to a lead 416 of the lead frame 403 through bond wires 406 and 404, which are electrically connected through the conductive trace 402. This configuration may eliminate wire crossing as described above or avoid violation of an assembly rule that prohibits a bond wire from being longer than a predetermined maximum length, e.g., about 200-300 mils. In this example, the conductive trace 402 provides a conductive path that allows bond wires 404, 406 to be less than the maximum length while still permitting a connection between the pad on the IC 401 and the lead 416. An encapsulant 418 may cover the MOSFETS 408, 410, the power IC 401, connecting wires and the first and second die pads 412 and 414 to provide a package body.

FIG. 5 is a cross-sectional view of a structure of MOSFET top layer having a routing of bonding wires according to another embodiment of the present invention. As shown in FIG. 5, the top source metal layer 506 including a source contact 508 is formed over active cell areas 502 within the MOSFET device. As used herein, the term cell generally refers to a structure within the MOSFET device that is configured to act as a field effect transistor. In this embodiment, a conductive trace 512 in the form of a metal trace is formed over an area 504 of the MOSFET device that contains inactive cells or no cells. If there is no electrical connection to the cells, they are rendered inactive. In the active regions there are openings in the oxide layer 510 to allow the source metal 506 to form source contacts 508. In this embodiment, there are no openings in the oxide layer 510 below the conductive trace 512. Alternatively or additionally, the process masks can be altered such that no cells are formed below the conductive trace 512. The conductive trace 512 is isolated from the inactive cells or no cells area with an oxide layer 510 and is optionally further isolated from the source metal layer 506 by passivation 524. The active cell area 502 and the inactive/no cell area 504 may be formed on a semiconductor substrate 516. A back metal layer 518 may be deposited on a bottom surface of the substrate 516. The conductive trace 512 does not significantly degrade MOSFET device performance as the percentage of cells affected is a very small portion of the total number of cells in the MOSFET. The exact percentage depends on total actual routing area. The total actual routing area should be kept to a minimum, and may be less than 5% than the active cell area.

Figure 6:
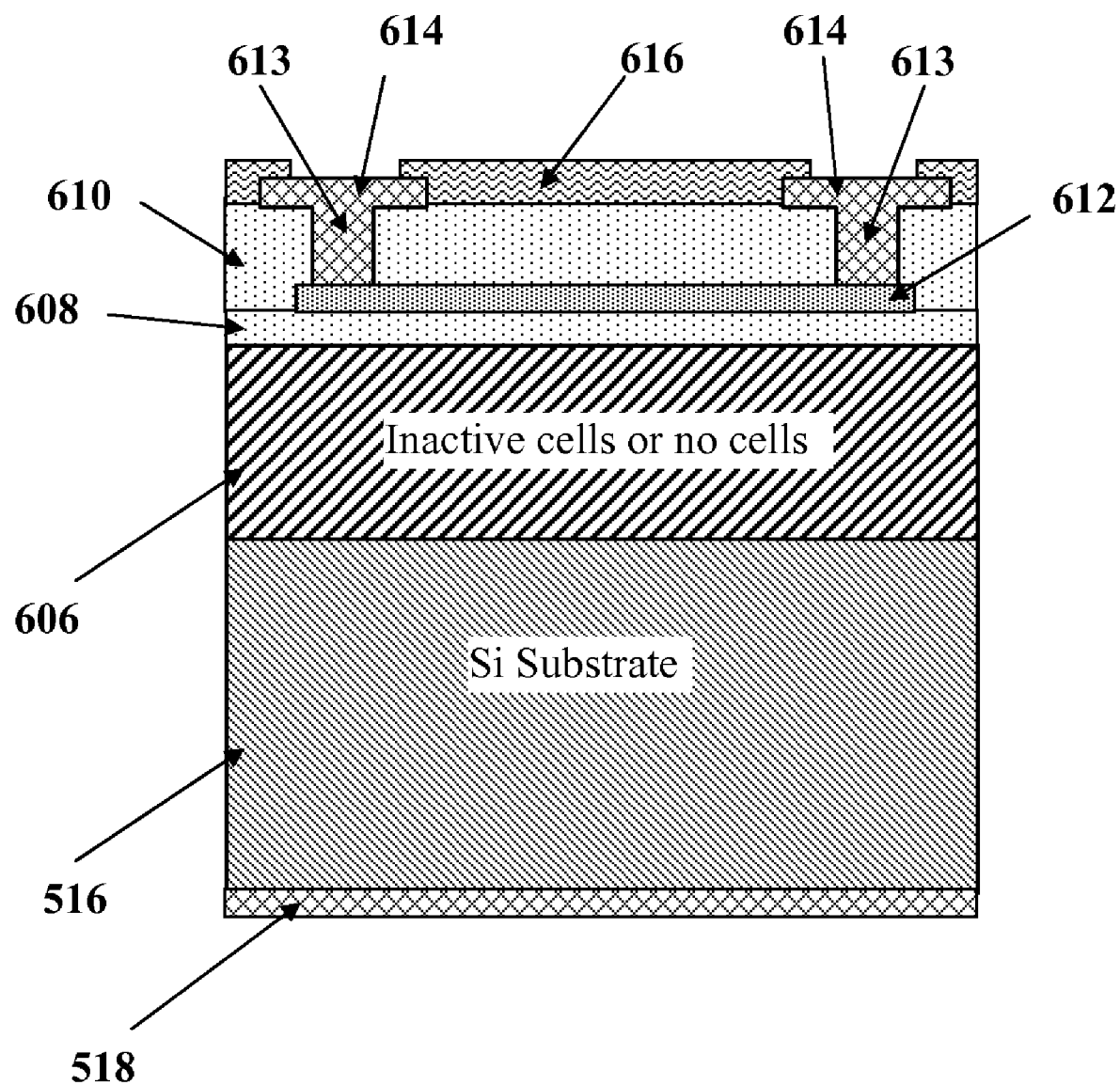
FIG. 6 is a cross-sectional view of an alternative structure of MOSFET top layer having a routing of bonding wires according to another embodiment of the present invention.

FIG. 6 is a cross-sectional view of an alternative structure of MOSFET top layer having a routing of bonding wires according to another embodiment of the present invention. In this embodiment, the conductive trace 612 is made from a layer of conductive polysilicon instead of from a layer of metal. The conductive polysilicon trace 612 is formed over an area 606 containing inactive cells or no cells. The trace 612 may be electrically isolated from the inactive/no cell area 606 by an insulation layer 608, (such as oxide). Electrically isolated vias 613 filled with conductive material, e.g. metal, may be formed through the MOSFET to provide electrical connection between to the polysilicon trace and a wire bonding pad 614. An insulation layer 610, (such as boro-phosphosilicate glass (BPSG) or tetraethyl orthosilicate (TEOS)) may electrically isolate the vias 613, the bonding pads 614 and the polysilicon trace 612 from a source metal (not shown) of the MOSFET. The insulation layers 608, 610 may also electrically isolate the metal layers from portions of the MOSFET. A passivation layer 616 may optionally be formed on top of the oxide layer 610 and between the bonding pads 614, and between the bonding pad 614 and a source metal (not shown). The bonding pads 614 may be formed from the same metal layer as the source metal. The polysilicon trace 612 may be formed from the same layer as a standard polysilicon ESD diode or a polysilicon resistor. To one skilled in the art it is apparent that if polysilicon ESD diodes (or a polysilicon resistor) are already made on the device, this embodiment does not require any additional mask steps—it only requires changes to some of the existing masks. The polysilicon conductive trace 612 does not significantly degrade MOSFET device performance as the percentage of cells affected is a very small portion of the total number of cells in the MOSFET. The exact percentage depends on total actual routing area.

There are a number of different possible variations on the embodiments described above. For example, the above-described solutions may be implemented in a DFN semiconductor package such as those described in US Patent Application Publication 20060145318. The designation DFN refers to a very popular package, dual flat non-lead package. The solution may also be implemented with other package types.

As discussed above, the die may include an electrically isolated conductive trace formed from a layer of conductive material. The conductive trace may be configured to provide an electrically conductive path between a first bond wire and a second bond wire. The conductive path may pass underneath a third bond wire thereby avoiding a crossing between the first or second bond wires with the third bond wire. Alternatively, or additionally, the conductive path may result in a reduced length for the first and second bond wires that is less than a predetermined maximum length.

Embodiments of the present invention also include a method for forming a semiconductor package assembly. As may be seen from FIG. 3A and FIG. 3B, the method may be implemented as follows.

a) A vertical discrete semiconductor device may be attached to a lead frame.
b) A power control integrated circuit (IC) may then be non-conductively stacked on top of the vertical discrete semiconductor device.
c) A portion of the top of the vertical discrete semiconductor device not covered by the power control IC may be used to form a conductive trace. It is noted that this may take place before a) or b).
d) A first bond wire is attached to a first end of the conductive trace and a second bond wire is attached to a second end of the conductive trace. The third bond wire crosses over the conductive trace, thereby avoiding a crossing between the first or second bond wires with a third bond wire.

By way of example, and not by way of limitation, the vertical discrete semiconductor device mentioned above may be a vertical MOSFET. The semiconductor package assembly may be a battery protection circuit module.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A semiconductor package assembly, comprising:
a lead frame having a first die bonding pad and a plurality of leads;
a first semiconductor device bonded to the first die bonding pad wherein the first semiconductor device comprises a vertical discrete semiconductor device; and
an electrically isolated conductive trace formed from a layer of conductive material in the top portion of the vertical discrete semiconductor device, wherein the conductive trace is configured to provide an electrically conductive path between a first bond wire and a second bond wire, wherein the first bond wire connects a first end of the electrically isolated conductive trace to a first lead of the plurality of leads, and the second bond wire is connected to a second end of the electrically isolated conductive trace and wherein either the conductive path passes underneath a third bond wire thereby avoiding the third bond wire crossing another bond wire, or wherein the conductive path results in a reduced length for the first or second bond wires that is less than a predetermined maximum length.

2. The semiconductor package assembly of claim 1, wherein the conductive trace comprises a metal trace.

3. The semiconductor package assembly of claim 1, wherein the conductive trace comprises a conductive polysilicon trace.

4. The semiconductor package assembly of claim 1 further comprising an encapsulant configured to at least partially cover the vertical discrete semiconductor device and the lead frame.

5. The semiconductor package assembly of claim 1, wherein the vertical discrete semiconductor device is a vertical metal oxide semiconductor field effect transistor (MOSFET).

6. The semiconductor package assembly of claim 1, wherein the vertical discrete semiconductor device comprises dual common-drain metal oxide semiconductor field effect transistors (MOSFETs).

7. The semiconductor package assembly of claim 1, further comprising a second semiconductor device wherein the second bond wire is electrically coupled between the second end of the conductive trace and the second semiconductor device.

8. The semiconductor package assembly of claim 7, wherein the second semiconductor device comprises a power control IC and wherein the vertical discrete semiconductor device comprises dual common-drain metal oxide semiconductor field effect MOSFETs.

9. The semiconductor package assembly of claim 8, wherein the power control IC is vertically stacked on top of the dual common-drain MOSFETs.

10. The semiconductor package assembly of claim 9, wherein the power control IC is non-conductively attached to the top of the dual common-drain MOSFETs.

11. The semiconductor package assembly of claim 7, wherein the lead frame further comprises a second die bonding pad, the first and second die bonding pads having a lateral separation therebetween wherein the second device is bonded to the second die bonding pad.

12. The semiconductor package assembly of claim 11, wherein the first semiconductor device is a vertical discrete MOSFET.

13. The semiconductor package assembly of claim 12, wherein the second semiconductor device is an integrated circuit.

14. The semiconductor package assembly of claim 6, wherein regions of the dual common drain MOSFETs under the conductive trace further comprise either inactive cells or no cells.

15. The semiconductor package assembly of claim 7 wherein the manufacturing of the first semiconductor device requires no additional masking steps.

16. The semiconductor package assembly of claim 1 wherein the total area of the conductive trace is less than 5% of the total active area of the vertical discrete MOSFET.

17. The semiconductor package assembly of claim 7, further comprising an encapsulant that at least partially covers the vertical discrete semiconductor device, the second device and the lead frame.

18. A battery protection package assembly, comprising: a lead frame;
a battery power control integrated circuit (IC);
first and second common-drain metal oxide semiconductor field effect transistors (MOSFETs) electrically coupled to the battery power control IC,
wherein the battery power control IC and the first and second common-drain MOSFETs are co-packaged on a die pad of the lead frame, wherein the power control IC is vertically stacked on top of at least one of the first and second common-drain MOSFETs,
wherein the first and/or second MOSFET include(s) one or more electrically isolated conductive traces formed from a layer of conductive material, wherein the conductive trace is configured to provide an electrically conductive path between a first bond wire and a second bond wire, wherein either the conductive path passes underneath a third bond wire thereby avoiding a crossing between the third bond wire with another bond wire or the conductive path results in a reduced length for the first and second bond wires that is less than a predetermined maximum length.

19. A method for forming a semiconductor package assembly comprising:
a) attaching a vertical discrete semiconductor device to a leadframe;
b) non-conductively stacking an integrated circuit (IC) on top of the vertical discrete semiconductor;
c) using a portion of the top of the vertical discrete semiconductor not covered by the power control IC to form a conductive trace;
d) attaching a first bond wire to a first end of the conductive trace and attaching a second bond wire to a second end of the conductive trace wherein the third bond wire crosses over the conductive trace thereby avoiding a crossing between the third bond wire with another bond wire or wherein the conductive path results in a reduced length for the first and second bond wires that is less than a predetermined maximum length.

20. The method of claim 19 wherein the vertical discrete semiconductor is a vertical MOSFET.

* * * * *